United States Patent
Lin et al.

(10) Patent No.: US 7,825,709 B2
(45) Date of Patent: Nov. 2, 2010

(54) TRI-STATE DELAY-TYPED PHASE LOCK LOOP

(75) Inventors: Pao-Chuan Lin, Hsinchu County (TW); Yi-Shuo Huang, Hualien County (TW); Ching-Tsa Pan, Hsinchu (TW); Po-Yen Chen, Taipei (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 12/466,974

(22) Filed: May 15, 2009

(65) Prior Publication Data

US 2010/0134156 A1     Jun. 3, 2010

(30) Foreign Application Priority Data

Dec. 3, 2008    (TW) .............................. 97147008 A

(51) Int. Cl.
    *H03L 7/06*    (2006.01)
(52) U.S. Cl. ...................... 327/156; 327/147
(58) Field of Classification Search .......... 327/147, 327/156, 158
See application file for complete search history.

(56) References Cited

U.S. PATENT DOCUMENTS

| | | | | |
|---|---|---|---|---|
| 4,527,145 A * | 7/1985 | Haussmann et al. | ......... | 348/537 |
| 6,201,578 B1 * | 3/2001 | Hosoya | ...................... | 348/572 |
| 6,768,358 B2 * | 7/2004 | Birk et al. | .................... | 327/156 |
| 6,927,611 B2 * | 8/2005 | Rhee et al. | ................... | 327/149 |
| 7,027,548 B1 * | 4/2006 | Palusa et al. | ................. | 375/375 |
| 7,196,588 B2 * | 3/2007 | Wang et al. | ................... | 331/17 |
| 7,332,973 B2 * | 2/2008 | Lee et al. | ....................... | 331/25 |
| 7,397,313 B2 * | 7/2008 | Wang et al. | ................... | 331/17 |
| 7,606,343 B2 * | 10/2009 | Nauta et al. | ................. | 375/376 |
| 7,719,328 B2 * | 5/2010 | Fu | .............................. | 327/156 |
| 7,719,335 B2 * | 5/2010 | Fu | .............................. | 327/158 |
| 2005/0084051 A1 * | 4/2005 | Nauta et al. | ................. | 375/376 |
| 2007/0096836 A1 * | 5/2007 | Lee et al. | ....................... | 331/57 |
| 2010/0110848 A1 * | 5/2010 | Honma | ..................... | 369/47.48 |

* cited by examiner

*Primary Examiner*—Lincoln Donovan
*Assistant Examiner*—Adam D Houston
(74) *Attorney, Agent, or Firm*—WPAT, PC; Justin King

(57) ABSTRACT

The present invention relates to a tri-state delay-typed phase lock loop, which comprises: a phase and frequency detector, a mode detector, a mode selector, a first sampling delay unit, a plurality of counters, a second sampling delay unit, and a phase and frequency calculator. The phase and frequency of the input reference signal can be determined automatically by the phase lock loop, and the output synchronization signal can be generated such that the frequency and the phase of the output synchronization signal are identical to those of the input reference signal.

9 Claims, 8 Drawing Sheets

| Positive edge tracking amending state | | | | Negative edge tracking amending state | | | |
|---|---|---|---|---|---|---|---|
| X(k-1)= {X3(k-1) X2(k-1) X1(k-1)} | X(k)= {X3(k) X2(k) X1(k)} | Timer1(k)= | Z(k)= | X(k-1)= {X3(k-1) X2(k-1) X1(k-1)} | X(k)= {X3(k) X2(k) X1(k)} | Timer2(k)= | Z(k)= |
| 000 | 001 | Timer1(k-1)+1 | 0 | 100 | 101 | X | 1 |
| 000 | 011 | X | 1 | 100 | 111 | X | 1 |
| 000 | 010 | Timer1(k-1)-1 | 0 | 100 | 110 | X | 1 |
| 000 | 000 | X | 1 | 100 | 100 | X | 1 |
| 001 | 001 | Timer1(k-1)+1 | 0 | 101 | 101 | Timer2(k-1)-1 | 1 |
| 001 | 011 | X | 1 | 101 | 111 | X | 1 |
| 001 | 010 | Timer1(k-1)-1 | 0 | 101 | 110 | Timer2(k-1)+1 | 1 |
| 001 | 000 | X | 1 | 101 | 100 | X | 0 |
| 010 | 001 | Timer1(k-1)+1 | 0 | 110 | 101 | Timer2(k-1)-1 | 1 |
| 010 | 011 | X | 1 | 110 | 111 | X | 1 |
| 010 | 010 | Timer1(k-1)-1 | 0 | 110 | 110 | Timer2(k-1)+1 | 1 |
| 010 | 000 | X | 1 | 110 | 100 | X | 0 |
| 011 | 001 | X | 0 | 111 | 001 | Timer2(k-1)-1 | 1 |
| 011 | 011 | X | 1 | 111 | 111 | X | 1 |
| 011 | 010 | X | 0 | 111 | 110 | Timer2(k-1)+1 | 1 |
| 011 | 000 | X | 1 | 111 | 100 | X | 0 |

FIG.6

TRI-STATE DELAY-TYPED PHASE LOCK LOOP

BACKGROUND OF THE INVENTION

1. Field of the Invention

The present invention relates to a tri-state delay-typed phase lock loop, more particularly, to the phase lock loop which automatically judges the phase and frequency of an input reference signal so as to synchronously generate an output synchronous signal, whereas the frequency and the phase of the output synchronous signal are identical to those of the input reference signal.

2. Description of the Prior Arts

The presently known digital phase lock loops are mostly serving the application for the communication signal processing, which is emphasized as a small signal usage, and vulnerable for its noisy inputs.

When a conventional digital phase lock loop is employed, the control method thereof is to use phase frequency detector to detect if the reference signal is set to be positive edge triggering or negative edge triggering so as to carry out the state change. Therefore, when said phase lock loop enters a steady state, if the reference signal is affected by exterior influences so as to cause the phase detector malfunction, correspondingly, the output synchronous signal generated by the phase lock loop will, in accordance with the malfunction, change its present state. The inevitable issue for avoiding the influence can be addressed by skilled person as the conventional digital phase lock loop locks its loop by using shift registers and counters for counting and generating a control signal, and the direction for counting and shifting follows the positive edge triggering and negative edge triggering after comparison with reference signal and synchronous signal to change the shifting direction or up-and-down signal, and there lacks a judge mechanism to suppress the malfunction due to the reference signal affected by exterior influence.

The conventional delay-typed phase lock loop, as long as its control delay unit is concerned, can be categorized as digital-typed, analog-typed, and digital-and-analog mixed-signal typed. For the digital-typed PLL, the control signal is stored in the registers, hence, when the circuit enters a sleep mode or is devoid of input signal, the signals recorded by said PLL will not disappear, alternatively, when the circuit restarts, said digital-typed PLL can achieve a locking state quickly. Various digital-typed PLLs are advantageous at fast locking, high process/supplying voltage tolerance, and more obvious while the process advances. However, since its delay is digitally controlled, the phase skew and jitter at locking state are getting worse while being compared with the conventional analog-typed PLL. In a digital-typed PLL a fixed byte of registers are applied, and its phase error is equivalent to a delay time that a delay unit can provide. If the phase skew and jitter are to be reduced, then the delay time that a delay unit can provide should be reduced, correspondingly, an operable frequency range, which a PLL can operate, is reduced. An ideal digital-typed PLL not only to be provided with a minimum phase skew and jitter, but also a maximum operable frequency range, however, it cannot be achieved within a limited die size, since the locking time is proportional to the counting of delay units and the wider the operating frequency range is, the longer its locking duration is needed.

Accordingly, in view of the above drawbacks, it is an imperative that a tri-state delay-typed PLL, which automatically adjusts the phase and frequency of the input reference signal and simultaneously generates an output synchronous signal identical to the input reference signal in their frequencies and phases, is designed so as to solve the drawbacks as the foregoing.

SUMMARY OF THE INVENTION

In view of the disadvantages of prior art, the primary object of the present invention relates to a tri-state delay-typed PLL, which automatically adjusts the phase and frequency of the input reference signal and simultaneously generates an output synchronous signal identical to the input reference signal in their frequencies and phases.

According to one aspect of the present invention, said tri-state delay-typed PLL, comprises:

- a phase and frequency detector, for receiving an input reference signal, an output synchronous feedback signal, and a system sampling signal so as to obtain a first sampling value and a second sampling value according to said input reference signal, said output synchronous feedback signal and system sampling signal;
- a mode detector, coupled to said phase and frequency detector, for receiving said first sampling value, said second sampling value, a previously sampling operating mode signal and said system sampling signal so as to obtain a positive edge tracking and recording counter value, a negative edge tracking and recording counter value, and a present sampling operating mode signal;
- a first sampling delay unit, coupled to said mode detector, for receiving said present sampling operating mode signal so as to obtain the previously sampling operating mode signal;
- a mode selector, coupled to said mode detector, for receiving said positive edge tracking and recording counter value, said negative edge tracking and recording counter value, and said present sampling operating mode signal so as to obtain a present operating mode record value;
- a plurality of recording counters, respectively coupled to said mode detector and said mode selector, for receiving said present operating mode record value, said present sampling operating mode signal and said system sampling signal so as to obtain an output synchronous signal;
- a second sampling delay unit, coupled to said counters, for receiving said output synchronous signal so as to obtain said output synchronous feedback signal; and
- a phase and frequency calculator, coupled to said mode detector, for receiving said positive edge tracking and recording counter value, said negative edge tracking and recording counter value and said present sampling operating mode signal so as to obtain an angular frequency signal and a phase signal.

According to another aspect of the present invention, one skilled in the art can automatically adjust the phase and frequency of the input reference signal, and synchronously generate an output synchronous signal identical to an input reference signal in respect to their frequency and phase. The present invention can be also applied to the synchronous signal for frequency and phase detection of communication fields, optical ruler positioning transformation, DC blushless motor driver phase detection, and synchronization of the frequency and phase on grid-type power conditioner.

BRIEF DESCRIPTION OF THE DRAWINGS

The present invention will become readily understood from the detailed description given herein below and the accompanying drawings which are given by way of illustration only, and thus are not limitative of the present invention and wherein:

FIG. 6 relates to the edge tracking amending states in the present invention;

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

Figure 1:
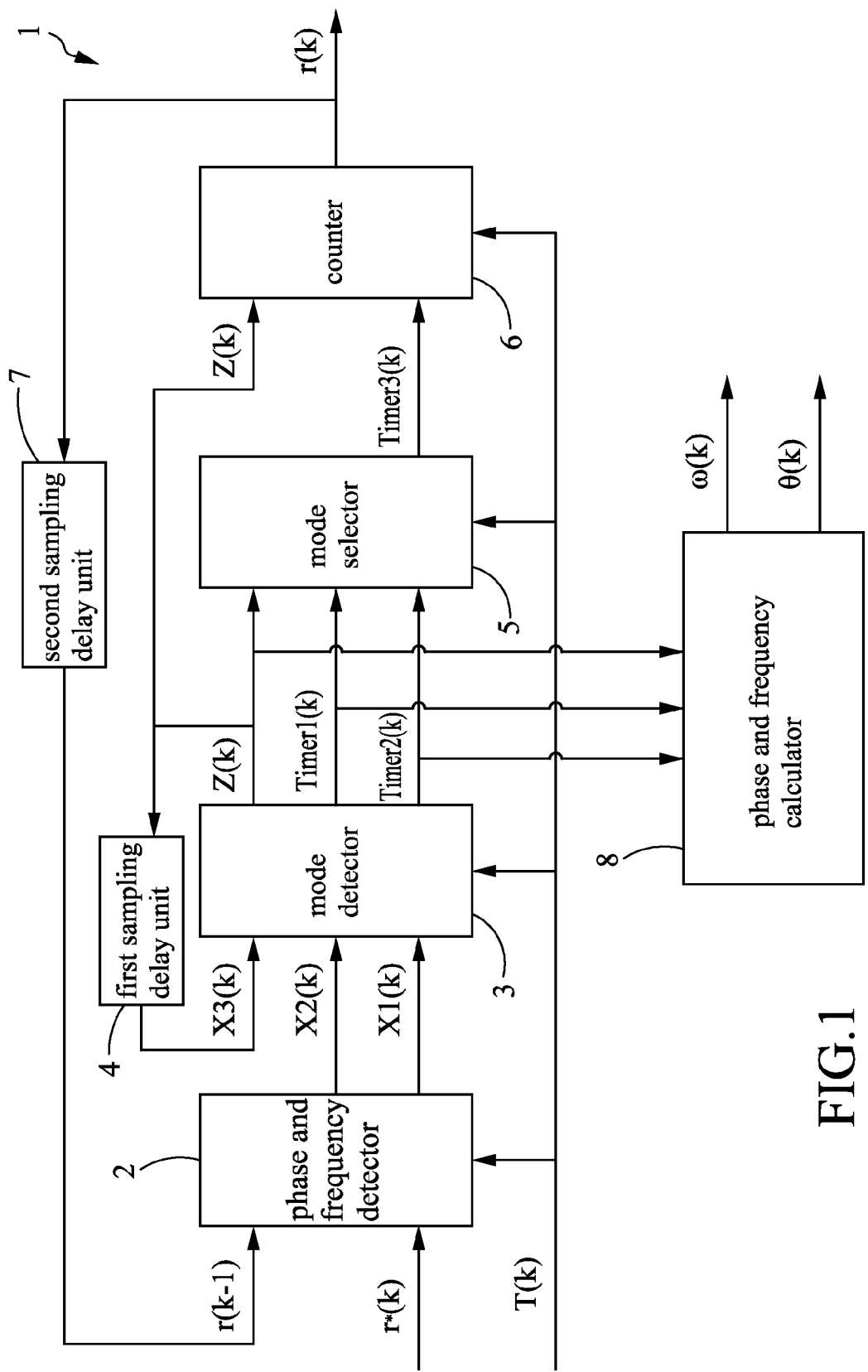
FIG. 1 relates to a systematic view of a preferred embodiment according to the present invention.

Please refer to FIG. 1, which relates to a systematic view of the embodiment of the present invention. The present invention relates to a tri-state delay-typed PLL 1, comprises: a phase and frequency detector 2, for receiving an input reference signal r*(k), an output synchronous feedback signal r(k−1), and a system sampling signal T(k) so as to obtain a first sampling value X1(k) and a second sampling value X2(k) according to said input reference signal r*(k), said output synchronous feedback signal r(k−1) and system sampling signal T(k); a mode detector 3, coupled to said phase and frequency detector 2, for receiving said first sampling value X1(k), said second sampling value X2(k), a previously sampling operating mode signal X3(k) and said system sampling signal T(k) so as to obtain a positive edge tracking and recording counter value Timer1(k), a negative edge tracking and recording counter value Timer2(k), and a present sampling operating mode signal Z(k); a first sampling delay unit 4, coupled to said mode detector 3, for receiving said present sampling operating mode signal Z(k) so as to obtain the previously sampling operating mode signal X3(k); a mode selector 5, coupled to said mode detector 3, for receiving said positive edge tracking and recording counter value Timer1(k), said negative edge tracking and recording counter value Timer2(k), and said present sampling operating mode signal Z(k) so as to obtain a present operating mode record value Timer3(k); generally speaking, the "mode" referred in the "mode selector", comprises a positive edge tracking amending state, a positive edge ahead tracking state, a positive edge lagging tracking state, a positive edge initial state, a positive edge ending state, a negative edge tracking amending state, a negative edge ahead tracking state, a negative edge lagging tracking state, a negative edge initial state and a negative edge ending state; a plurality of counters 6, respectively coupled to said mode detector 3 and said mode selector 5, for receiving said present operating mode record value Timer3(k), said present sampling operating mode signal Z(k) and said system sampling signal T(k) so as to obtain an output synchronous signal r(k); when said mode selector 5's mode is set to be the positive edge ahead tracking state, the values of said a plurality of counters 6 is decreased by 1; when said mode selector 5's mode is set to be the positive edge lagging tracking state, the values of said a plurality of counters 6 is increased by 1; when said mode selector 5's mode is set to be the negative edge ahead tracking state, the values of said a plurality of counters 6 is increased by 1; and when said mode selector 5's mode is set to be the negative edge lagging tracking state, the values of said a plurality of counters 6 is decreased by 1; wherein the way to increase or decrease the value is consisting of fuzzy control, polynomial functions, or exponential function but not limited thereto, if one of said a plurality of counters stops counting, logic 1 is outputted, and if another one of said a plurality of counters stops counting, logic 0 is outputted; a second sampling delay unit 7, coupled to said counters 6, for receiving said output synchronous signal r(k) so as to obtain said output synchronous feedback signal r(k−1); and a phase and frequency calculator 8, coupled to said mode detector 3, for receiving said positive edge tracking and recording counter value Timer1(k), said negative edge tracking and recording counter value Timer2(k) and said present sampling operating mode signal Z(k) so as to obtain an angular frequency signal ω(k) and a phase signal θ(k).

Please refer to FIG. 6 as follows, which relates to a logic judge table for state judgment of the present invention. Hereby the present invention categorizes a reference signal into the group of positive edge tracking amending state and negative edge tracking amending state, and these two states are respectively referring to a positive tracking and recording counter value Timer1(k) and a negative tracking and recording counter value Timer2(k) so as to output the counting time of logic "1" and "0", meanwhile, a three-bit state variable is utilized to demonstrate the functionality of the present invention. As a result, the present invention can be categorized into 8 states, which are: an initial state (000 and 111), an ending state (011 and 100), an ahead tracking state (001 and 010), and a lagging tracking state (101 and 110). While the third bit of the state variable is 0, it means that the PLL in the present invention is in the positive tracking amending state; otherwise, it is in the negative tracking amending state. And the $2^{nd}$ bit and the $1^{st}$ bit can be obtained by the logic values corresponding to input reference signal r*(k) and output synchronous feedback signal r(k−1) feed-backed by the phase and frequency detector 2.

At the beginning, a positive edge tracking amending state is illustrated for the action in the present invention. At the initial stage, the initial state of the present invention is set to be "000", at this time, a phase and frequency detector 2 is used to judge the logic values for said input reference signal r*(k) and said input synchronous feedback signal r(k−1). When the state variable in the present invention is "000", the edge tracking and recording counter value Timer1(k) is unaltered. When the state variable in the present invention is switched from "000" to "010", said output synchronous feedback signal r(k−1) is lagging behind said input reference signal r*(k) thus the positive edge tracking and recording counter value Timer1(k) is increased. When the state variable in the present invention switched from "000" to be "001", said output synchronous feedback signal r(k–1) is leading ahead said input reference signal r*(k) thus the positive edge tracking and recording counter value Timer1(k) is decreased. When the state variable in the present invention switched from "000" to be "011", the state values represented by said output synchronous feedback signal r(k–1) and said input reference signal r*(k) are changed simultaneously, it means positive edge tracking control is completed, meanwhile, the state of the present invention switches from the ending state of the positive edge tracking amending state to the initial state "111" of the negative edge amending state. Similar to the functionality related to the positive edge tracking, the phase and frequency detector 2 is used to judge the logic value corresponding to the input reference signal r*(k) and the output synchronous feedback signal r(k–1), exemplarily, while the present invention is in the initial state "111", then the negative edge tracking counting record Timer2(k) is unaltered. When the state variable of the present invention switches from "111" to "101", the output synchronous feedback signal r(k–1) is lagging behind the input reference signal r*(k), meanwhile, the negative edge tracking record Timer2(k) is increased by his value. When the state variable of the present invention switches from "111" to "110", the output synchronous feedback signal r(k–1) is leading ahead the input reference signal r*(k), meanwhile, the negative edge tracking record Timer2(k) is decreased by his value. When the state variable of the present invention switches from "111" to "100", the logic values represented by the output synchronous feedback signal r(k–1) and the input reference signal r*(k) are altered simultaneously, meanwhile, the negative edge tracking record Timer2(k) is increased by his value completely, thus, the present invention switches from the ending state of the negative edge tracking amending state to the initial state "000" of the positive edge tracking amending state.

Figure 2:
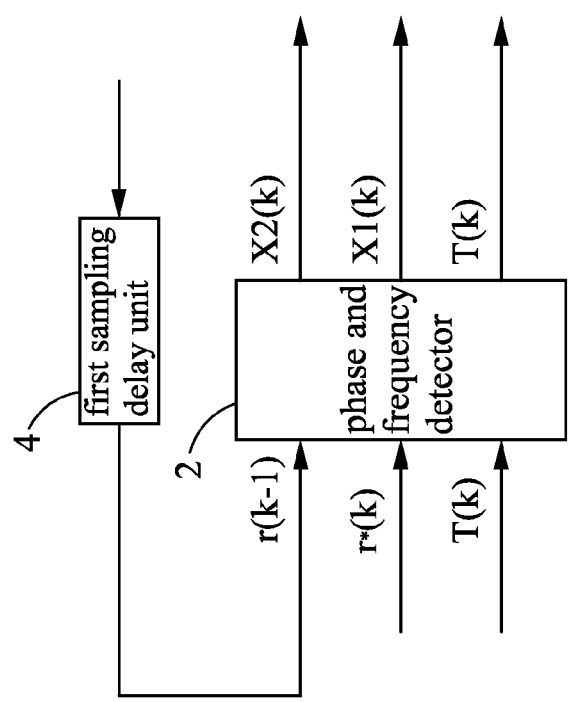
FIG. 2 relates to a block diagram of a phase and frequency detector according to the present invention.
Figure 3:
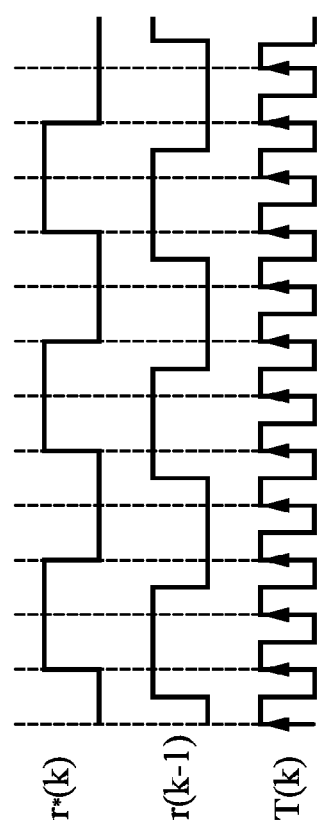
FIG. 3 relates to a sampling waveform of a phase and frequency detector according to the present invention.

FIG. 2 and FIG. 3 relate to a block diagram of the phase and frequency detector and a sampling waveform of the phase and frequency detector disclosed in the present invention. The phase and frequency detector 2 feedbacks the logic variation between the input reference signal r*(k) and the output synchronous feedback signal r(k–1) to the mode detector 3 so as to obtain the variation of phase and frequency of the input reference signal r*(k). The data formality of the input reference signal r*(k) is a logic signal, ranged within "0" and "1". And the output synchronous feedback signal r(k–1) is a signal for which the output synchronous signal r(k) is processed by the second sampling delay unit 7, and its data formality is a logic signal, ranged within "0" and "1". For the system sampling signal T(k), its sampling period is 10 ns at sampling frequency 100 MHz. The first sampling value X1(k) and the second sampling value X2(k) are the outcomes after sampling the input reference r*(k) and the output synchronous feedback signal r(k–1). For the mutual relationships between the aforementioned signals, can be expressed in the mathematic formula as follows:

$$\delta_T(K) == \begin{cases} 1, & \text{at sampling time} \\ 0, & \text{otherwise} \end{cases}$$

$$X_1(k) = r(k-1) * \delta_T(K)$$

$$X_2(k) = r^*(k) * \delta_T(K)$$

wherein, $\delta_T(K) = T(k)$ $$X_3(K) = \begin{cases} 0, & X_3(K-1)X_2(K)X_1(K) = 0xx \\ 1, & X_3(K-1)X_2(K)X_1(K) = 011 \\ 1, & X_3(K-1)X_2(K)X_1(K) = 1xx \\ 0, & X_3(K-1)X_2(K)X_1(K) = 100 \end{cases}$$

x: don't care $$X_3(K) = \overline{X_3(K-1)}X_2 X_1 + X_3(K-1)\overline{X_2(K)X_1(K)}$$

$$\text{Timer1}(K) = \begin{cases} \text{Timer1}(K-1), & (X_2(K) \text{ XOR } X_1(K)) = 0 \\ \text{Timer1}(K-1)+1, & X_2(K) = 0 \text{ and } X_1(K) = 1 \\ \text{Timer1}(K-1)-1, & X_2(K) = 1 \text{ and } X_1(K) = 0, \end{cases}$$

when $X_3(K-1) = 0$ $$\text{Timer2}(K) = \begin{cases} \text{Timer2}(K-1), & (X_2(K) \text{ XOR } X_1(K)) = 0 \\ \text{Timer2}(K-1)+1, & X_2(K) = 1 \text{ and } X_1(K) = 0 \\ \text{Timer2}(K-1)-1, & X_2(K) = 0 \text{ and } X_1(K) = 1, \end{cases}$$

when $X_3(K-1) = 1$ $$\text{Timer3}(K) = \text{Timer1}(K) \times X_3(K) + \text{Timer2}(K) \times \overline{X_3(K)}$$

Counter(K) =

$$\begin{cases} 0, & \text{when Counter}(K-1) \geq \text{Timer1}(K) \text{ and } X_3(K) = 0 \\ 0, & \text{when Counter}(K-1) \geq \text{Timer2}(K) \text{ and } X_3(K) = 1 \\ \text{Counter}(K-1)+1, & \text{otherwise} \end{cases}$$

-continued $$r(K) = \begin{cases} 1, & \text{when counter}(K) \geq \text{Timer1}(K) \text{ and } X_3(K) = 0 \\ 0, & \text{when counter}(K) < \text{Timer1}(K) \text{ and } X_3(K) = 0 \\ 0, & \text{when counter}(K) \geq \text{Timer2}(K) \text{ and } X_3(K) = 1 \\ 1, & \text{when counter}(K) < \text{Timer2}(K) \text{ and } X_3(K) = 1 \end{cases}$$

Figure 4A:
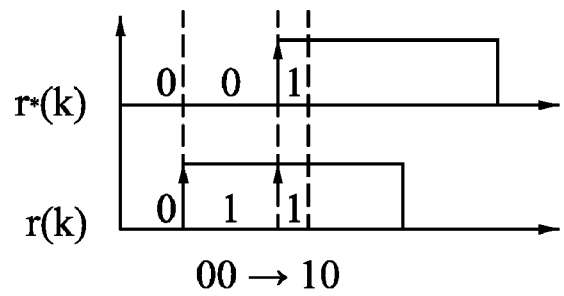
FIG. 4(A)~4(C) relate to a relation diagram between the input reference signal and the output synchronous signal while the PLL in the present invention is operating in the positive tracking amending state.
Figure 4B:
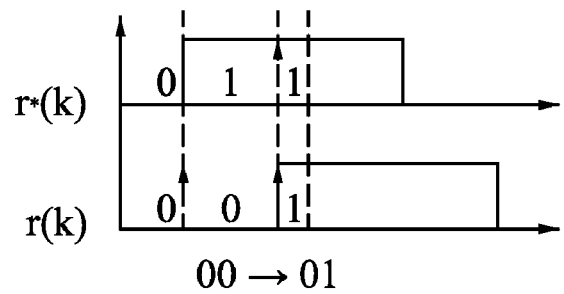
Figure 4C:
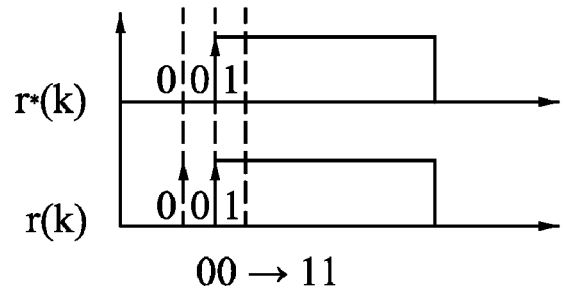
Figure 4D:
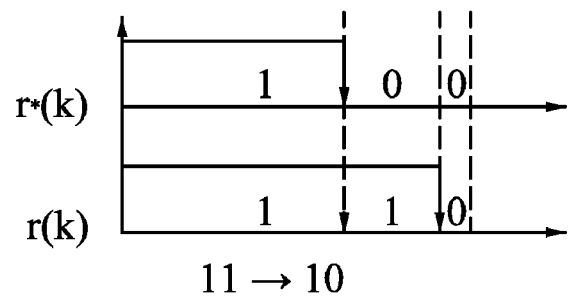
FIG. 4(D)~4(F) relate to a relation diagram between the input reference signal and the output synchronous signal while the PLL in the present invention is operating in the negative tracking amending state.
Figure 4E:
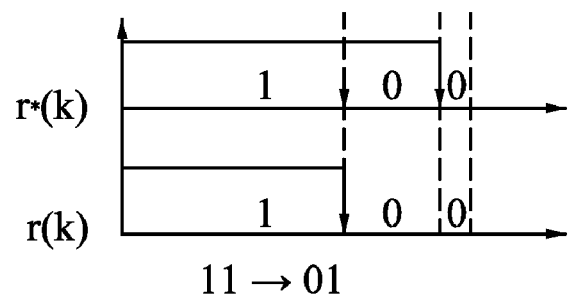
Figure 4F:
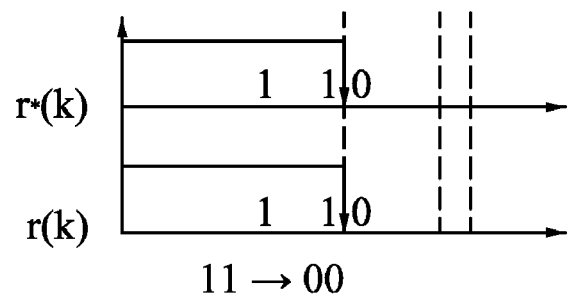

FIG. 4(A)~FIG. 4(C) relate to the relationship between the input reference signal r*(k) and the output synchronous signal r(k) while the PLL in the present invention operating in the positive edge tracking amending state; and FIG. 4(D)~FIG. 4(F) relate to the relationship between the input reference signal and the feedback control signal while the PLL in the present invention operating in the negative edge tracking amending state Turning up to FIG. 4(A) now, while the PLL of the present invention operating in the positive edge tracking amending state and the input reference signal r*(k) lagging behind the output synchronous feedback signal r(k−1), after the phase and frequency detector 2 detects the operating state of the present invention, a state variable "10" is obtained, i.e., the positive edge tracking record value Timer1(k) corresponding to the output synchronous feedback signal r(k−1) is relatively smaller, hence, the positive edge tracking record value Timer1(k) is increased by 1. As suggested by FIG. 4(B), while the PLL of the present invention operating in the positive edge tracking amending state and the input reference signal r*(k) leading ahead the output synchronous feedback signal r(k−1), after the phase and frequency detector 2 detects the operating state of the present invention, a state variable "01" is obtained, i.e., the positive edge tracking record value Timer1(k) corresponding to the output synchronous feedback signal r(k−1) is relatively larger, hence, the positive edge tracking record value Timer1(k) is decreased by 1. As suggested by FIG. 4(C), while the PLL of the present invention operating in the positive edge tracking amending state, and the input reference signal r*(k) and the output synchronous feedback signal r(k−1) varied synchronously, after the phase and frequency detector 2 detects the operating state of the present invention, a state variable "11" is obtained, which means, the positive edge tracking amending state is completed, i.e., the mode detector 3 will change the operating mode of the present invention to be negative edge tracking amending state and enter its initial state which has a state variable "000".

Turning up to FIG. 4(D) now, while the PLL of the present invention operating in the negative edge tracking amending state and the input reference signal r*(k) leading ahead the output synchronous feedback signal r(k−1), after the phase and frequency detector 2 detects the operating state of the present invention, a state variable "10" is obtained, i.e., the positive edge tracking record value Timer1(k) corresponding to the output synchronous feedback signal r(k−1) is relatively larger, hence, the positive edge tracking record value Timer1(k) is decreased by 1. As suggested by FIG. 4(E), while the PLL of the present invention operating in the negative edge tracking amending state and the input reference signal r*(k) lagging behind the output synchronous feedback signal r(k−1), after the phase and frequency detector 2 detects the operating state of the present invention, a state variable "01" is obtained, i.e., the positive edge tracking record value Timer1(k) corresponding to the output synchronous feedback signal r(k−1) is relatively smaller, hence, the positive edge tracking record value Timer1(k) is increased by 1. As suggested by FIG. 4(F), while the PLL of the present invention operating in the negative edge tracking amending state, and the input reference signal r*(k) and the output synchronous feedback signal r(k−1) varied synchronously, after the phase and frequency detector 2 detects the operating state of the present invention, a state variable "00" is obtained, which means, the negative edge tracking amending state is completed, i.e., the mode detector 3 will change the operating mode of the present invention to be positive edge tracking amending state and enters its initial state which has a state variable "111".

Figure 5A:
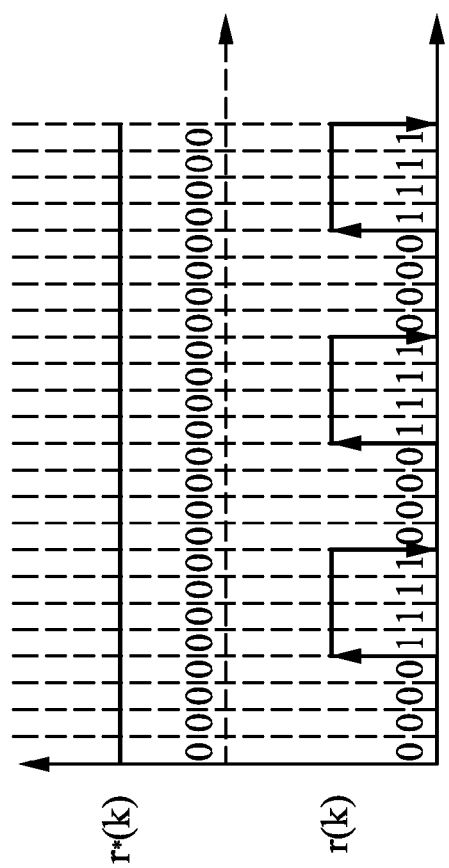
FIGS. 5(A) and 5(B) relate to waveform plot according to the present invention being devoid of the input reference signal.
Figure 5B:
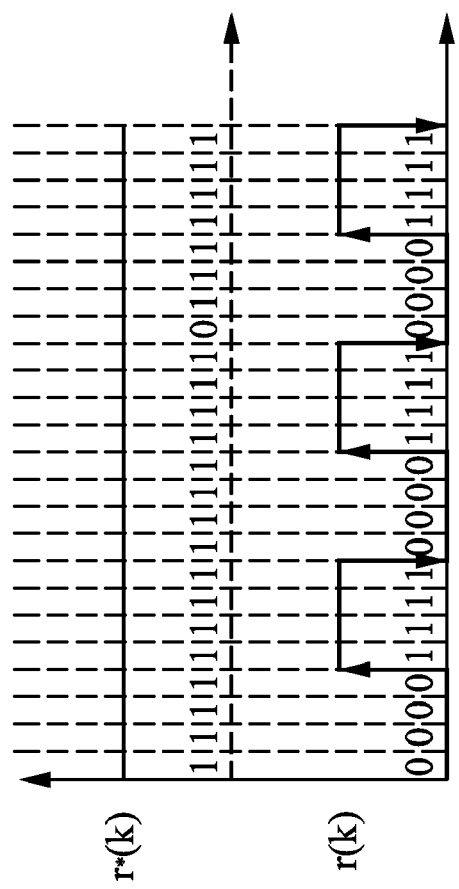

FIG. 5(A) and FIG. 5(B) relate to the waveform diagram for the present invention while being devoid of input reference signal. At the beginning, while the input reference signal r*(k) is affixed at "0", it's waveform variation is illustrated in FIG. 5(A), and while the case of devoid of input reference signal r*(k) happening at the positive edge tracking amending state, the feedback states of the phase and frequency detector 2 are restricted in "00" and "10", therefore, referring to aforesaid FIG. 6, while switching the state variable from "00" to "00", the PLL in the present invention stays non-functioning. And while the state variable switches from "00" to "10", the positive edge tracking record value Timer1(k) is increased by 1 in the present invention. Again, while the state variable switches from "10" to "10", the positive edge tracking record value Timer1(k) is also increased by 1 in the present invention. Therefore, all relative operations with respect to the positive edge tracking record value Timer1(k) is increased by 1. When the positive edge tracking record value Timer1(k) is larger than the maximum of the positive edge tracking record value Timer1(k), the present invention will be forced to enter the negative edge tracking amending state, at this time, the mechanism of limiting frequency range can restrict the positive edge tracking record value Timer1(k) in the maximum of the positive edge tracking record value Timer1(k).

While the case of devoid of input reference signal r*(k) happening at the negative edge tracking amending state, the feedback states of the phase and frequency detector 2 is restricted in "00" and "10", therefore, referring to aforesaid FIG. 6, while switching the state variable from "00" to "00", the present invention enters the positive edge tracking amending state. And while the state variable switches from "00" to "10", the negative edge tracking record value Timer2(k) is decreased by 1 in the present invention. Again, while the state variable switches from "10" to "10", the negative edge tracking record value Timer2(k) is also decreased by 1 in the present invention. Therefore, all relative operations with respect to the negative edge tracking record value Timer2(k) is decreased by 1. When the negative edge tracking record value Timer2(k) is smaller than the minimum of the negative edge tracking record value Timer2(k), the PLL in the present invention will insert the minimum into said Timer2(k) and be forced to enter the positive edge tracking amending state, at this time, the mechanism of limiting frequency range can restrict the negative edge tracking record value Timer2(k) in the minimum of the negative edge tracking record value Timer2(k). Finally the period for the output synchronous signal in the present invention is:

$$\text{Timer} = \text{Timer1}_{maximum} + \text{Timer2}_{minimum}$$

$$\text{Timer1}(K+1) = \begin{cases} \text{Timer1}(K), & (B(K) \text{ XOR } A(K)) = 0 \\ \text{Timer1}(K)+1, & B(K) = 0 \text{ and } A(K) = 1 \\ \text{Timer1}(K)-1, & B(K) = 1 \text{ and } A(K) = 0 \\ \text{Timer1}_{maximum}, & \text{when Timer1} \geq \text{Timer1}_{maximum} \\ \text{Timer1}_{minimum}, & \text{when Timer1} \leq \text{Timer1}_{minimum}, \end{cases}$$

when $C(K) = 0$

While the input reference signal r*(k) is affixed at "1", it's waveform variation is illustrated in FIG. 5(B), and while the case of devoid of input reference signal r*(k) happening at the positive edge tracking amending state, the feedback states of the phase and frequency detector 2 are restricted in "01" and "11", therefore, referring to aforesaid FIG. 6, while switching the state variable from "11" to "11", the PLL in the present invention enters the positive edge tracking amending state. And while the state variable switches from "11" to "01", the positive edge tracking record value Timer1(k) is decreased by 1 in the present invention. Again, while the state variable switches from "01" to "01", the positive edge tracking record value Timer1(k) is also decreased by 1 in the present invention. Therefore, all relative operations with respect to the positive edge tracking record value Timer1(k) is decreased by 1. When the positive edge tracking record value Timer1(k) is smaller than the minimum of the positive edge tracking record value Timer1(k), the present invention will insert the minimum of the positive edge tracking record value Timer1(k) into the Timer1(k) and be forced to enter the negative edge tracking amending state, at this time, the mechanism of limiting frequency range can restrict the positive edge tracking record value Timer1(k) in the minimum of the positive edge tracking record value Timer 1(k).

While the case of devoid of input reference signal r*(k) happening at the negative edge tracking amending state, the feedback state of the phase and frequency detector 2 is restricted in "11" and "01", therefore, referring to aforesaid FIG. 6, while switching the state variable from "11" to "11", the PLL in the present invention stays non-functioning. And while the state variable switches from "11" to "01", the negative edge tracking record value Timer2(k) is increased by 1 in the present invention. Again, while the state variable switches from "01" to "01", the negative edge tracking record value Timer2(k) is also increased by 1 in the present invention. Therefore, all relative operations with respect to the negative edge tracking record value Timer2(k) is increased by 1. When the negative edge tracking record value Timer2(k) is larger than the maximum of the negative edge tracking record value Timer2(k), the PLL in the present invention will insert the minimum into said Timer2(k) and be forced to enter the positive edge tracking amending state, at this time, the mechanism of limiting frequency range can restrict the negative edge tracking record value Timer2(k) in the maximum of the negative edge tracking record value Timer2(k). Finally the period for the output synchronous signal in the present invention is:

$$\text{Timer} = \text{Timer1}_{minimum} + \text{Timer2}_{maximum}$$

From the aforesaid operations in the present invention, one skilled in the ordinary art can know, when the input reference signal r*(k) lacks switching but tends to stay at some logic value "0" or "1", the positive tracking record value Timer1(k) and the negative tracking record value Timer2(k) will respectively be the maximum or the minimum for the limited value. While the input reference signal is affixed at "0", the positive tracking record value Timer1(k) is the maximum of the Timer1(k) and the negative tracking record value Timer2(k) is the minimum of the Timer2(k). While the input reference signal is affixed at "1", the positive tracking record value Timer1(k) is the minimum of the Timer1(k) and the negative tracking record value Timer2(k) is the maximum of the Timer2(k). Consequently, the behavior in the present invention can be used for establishing a mechanism as a base to judge if the islanding effect happens.

$$\text{Timer2}(K+1) = \begin{cases} \text{Timer2}(K), & (B(K) \text{ XOR } A(K)) = 0 \\ \text{Timer2}(K)+1, & B(K) = 1 \text{ and } A(K) = 0 \\ \text{Timer2}(K)-1, & B(K) = 0 \text{ and } A(K) = 1 \\ \text{Timer2}_{maximum}, & \text{when Timer2} \geq \text{Timer2}_{maximum} \\ \text{Timer2}_{minimum}, & \text{when Timer2} \leq \text{Timer2}_{minimum}, \end{cases}$$

when $C(K) = 1$

According to the aforementioned of the present invention, one skilled in the art can automatically adjust the phase and frequency of the input reference signal, and synchronously generate an output synchronous signal identical to an input reference signal in frequency and phase. The present invention can be also applied to the synchronous signal for communication frequency and phase detection, optical ruler time transfer to time, DC blushless motor driving phase detection, and distributed-type generator in parallel control's frequency and phase.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A tri-state delay-typed phase lock loop, comprising:
a phase and frequency detector, for receiving an input reference signal, an output synchronous feedback signal, and a system sampling signal so as to obtain a first sampling value and a second sampling value according to said input reference signal, said output synchronous feedback signal and system sampling signal;
a mode detector, coupled to said phase and frequency detector, for receiving said first sampling value, said second sampling value, a previously sampling operating mode signal and said system sampling signal so as to obtain a positive edge tracking and recording counter value, a negative edge tracking and recording counter value, and a present sampling operating mode signal;
a first sampling delay unit, coupled to said mode detector, for receiving said present sampling operating mode signal so as to obtain the previously sampling operating mode signal;
a mode selector, coupled to said mode detector, for receiving said positive edge tracking and recording counter value, said negative edge tracking and recording counter value, and said present sampling operating mode signal so as to obtain a present operating mode record value;
a plurality of counters, respectively coupled to said mode detector and said mode selector, for receiving said present operating mode record value, said present sampling operating mode signal and said system sampling signal so as to obtain an output synchronous signal;

a second sampling delay unit, coupled to said counters, for receiving said output synchronous signal so as to obtain said output synchronous feedback signal; and a phase and frequency calculator, coupled to said mode detector, for receiving said positive edge tracking and recording counter value, said negative edge tracking and recording counter value and said present sampling operating mode signal so as to obtain an angular frequency signal and a phase signal.

2. The tri-state delay-typed phase lock loop of claim 1, wherein the mode referred in said mode selector comprises a positive edge tracking amending state, a positive edge ahead tracking state, a positive edge lagging tracking state, a positive edge initial state, a positive edge ending state, a negative edge tracking amending state, a negative edge ahead tracking state, a negative edge lagging tracking state, a negative edge initial state and a negative edge ending state.

3. The tri-state delay-typed phase lock loop of claim 2, wherein if the mode is set to be said positive edge ahead tracking state, said a plurality of counters are decreased by 1 for their values.

4. The tri-state delay-typed phase lock loop of claim 2, wherein if the mode is set to be said positive edge lagging tracking state, said a plurality of counters are increased by 1 for their values.

5. The tri-state delay-typed phase lock loop of claim 2, wherein if the mode is set to be said negative edge ahead tracking state, said a plurality of counters are decreased by 1 for their values.

6. The tri-state delay-typed phase lock loop of claim 2, wherein if the mode is set to be said negative edge lagging tracking state, said a plurality of counters are increased by 1 for their values.

7. The tri-state delay-typed phase lock loop of claims 3, 4, 5, and 6, wherein the values of said a plurality of counters are varied by fuzzy control, polynomial function, or exponential function.

8. The tri-state delay-typed phase lock loop of claim 1, wherein if one of said a plurality of counters stops counting, logic 1 is outputted.

9. The tri-state delay-typed phase lock loop of claim 1, wherein if another one of said a plurality of counters stops counting, logic 0 is outputted.

* * * * *